(12) United States Patent
Hu et al.

(10) Patent No.: US 11,809,838 B2
(45) Date of Patent: *Nov. 7, 2023

(54) MEMORY DEVICE AND OPERATION METHOD THEREOF

(71) Applicant: MACRONIX INTERNATIONAL CO., LTD., Hsinchu (TW)

(72) Inventors: Han-Wen Hu, Tainan (TW); Yung-Chun Lee, New Taipei (TW); Bo-Rong Lin, Taichung (TW); Huai-Mu Wang, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 224 days.

This patent is subject to a terminal disclaimer.

(21) Appl. No.: 17/365,034

(22) Filed: Jul. 1, 2021

(65) Prior Publication Data

US 2022/0075599 A1    Mar. 10, 2022

Related U.S. Application Data

(60) Provisional application No. 63/075,307, filed on Sep. 8, 2020.

(51) Int. Cl.
*G06F 7/544* (2006.01)
*G11C 7/06* (2006.01)

(52) U.S. Cl.
CPC ............. *G06F 7/5443* (2013.01); *G11C 7/06* (2013.01)

(58) Field of Classification Search
CPC ...... G06F 7/5443; G06F 7/443; G06F 7/4876; G06F 7/607; G06F 15/7821; G06F 17/16; G06F 2207/4824; G11C 7/06; G11C 2207/063; G11C 7/067; G11C 7/1006; G11C 7/065; G06N 3/063
See application file for complete search history.

(56) References Cited

U.S. PATENT DOCUMENTS

| | | | |
|---|---|---|---|
| 10,643,119 B2 | 5/2020 | Chiu et al. | |
| 10,915,298 B1* | 2/2021 | Far | G06N 3/065 |
| 11,573,792 B2* | 2/2023 | Kim | G06F 9/3001 |
| 11,587,616 B2* | 2/2023 | Lee | G11C 7/1006 |
| 2020/0026498 A1 | 1/2020 | Sumbul et al. | |
| 2020/0034686 A1 | 1/2020 | Chiu et al. | |
| 2020/0210369 A1 | 7/2020 | Song | |
| 2021/0151106 A1 | 5/2021 | Wang | |
| 2021/0311703 A1* | 10/2021 | Kim | G06N 3/063 |

FOREIGN PATENT DOCUMENTS

| | | |
|---|---|---|
| CN | 110782026 A | 2/2020 |
| JP | 2019139300 A | 8/2019 |
| WO | 2020046495 A1 | 3/2020 |

* cited by examiner

*Primary Examiner* — Ajay Ojha
(74) *Attorney, Agent, or Firm* — McClure, Qualey & Rodack, LLP

(57) ABSTRACT

A memory device and an operation method thereof are provided. The memory device includes: a memory array including a plurality of memory cells for storing a plurality of weights; a multiplication circuit coupled to the memory array, for performing bitwise multiplication on a plurality of input data and the weights to generate a plurality of multiplication results; a counting unit coupled to the multiplication circuit, for performing bitwise counting on the multiplication results to generate a MAC (multiplication and accumulation) operation result.

16 Claims, 12 Drawing Sheets

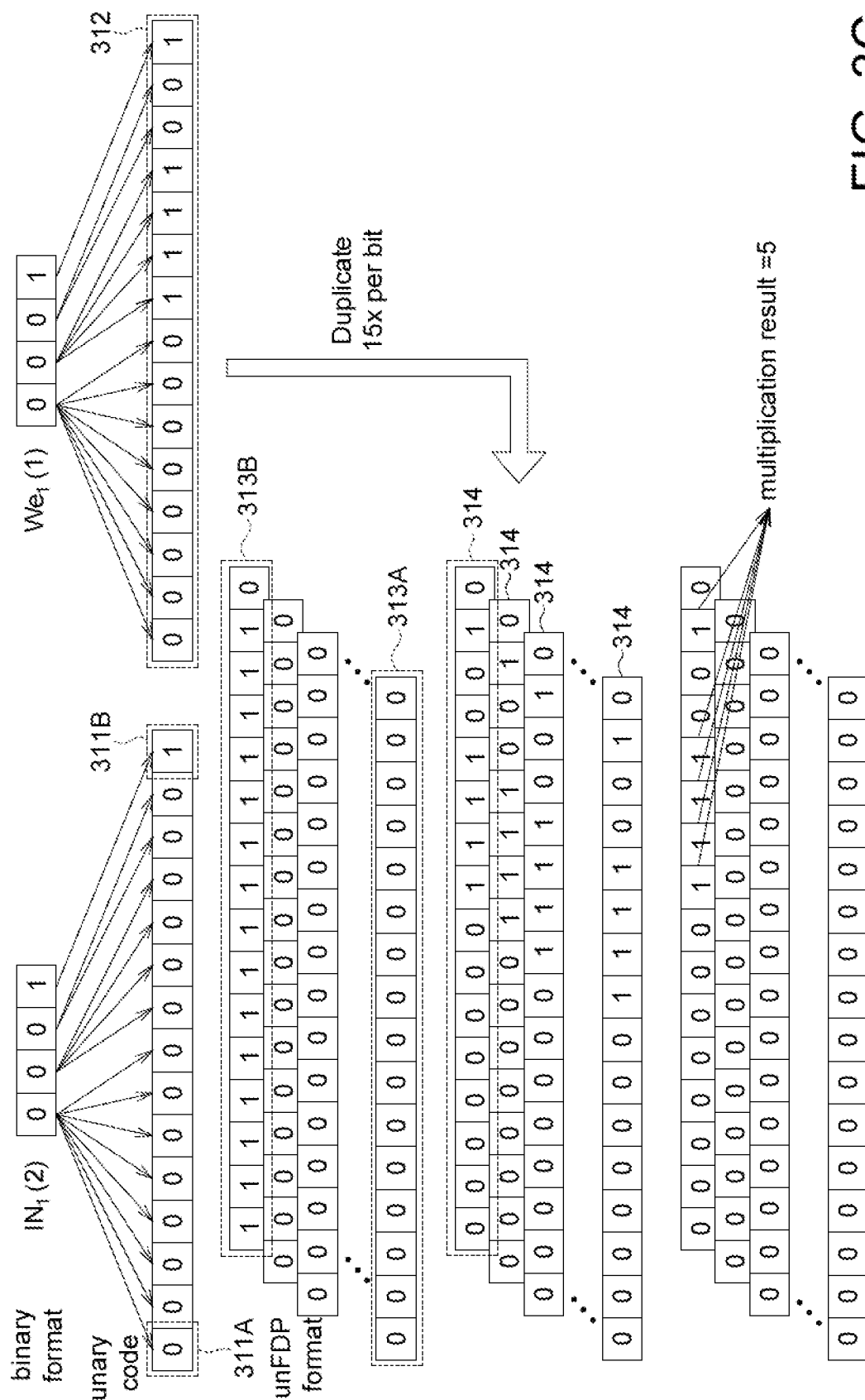

MEMORY DEVICE AND OPERATION METHOD THEREOF

This application claims the benefit of U.S. provisional application Ser. No. 63/075,307, filed Sep. 8, 2020, the subject matter of which is incorporated herein by reference.

TECHNICAL FIELD

The disclosure relates in general to an In-Memory-Computing memory device and an operation method thereof.

BACKGROUND

Artificial Intelligence ("AI") has recently emerged as a highly effective solution for many fields. The key issue in AI is that AI contains large amounts of input data (for example input feature maps) and weights to perform multiply-and-accumulation (MAC).

However, the current AI structure usually encounters IO (input/output) bottleneck and inefficient MAC operation flow.

In order to achieve high accuracy, it would perform MAC operations having multi-bit inputs and multi-bit weights. But, the IO bottleneck becomes worse and the efficiency is lower.

In-Memory-Computing ("IMC") can accelerate MAC operations because IMC may reduce complicated arithmetic logic unit (ALU) in the process centric architecture and provide large parallelism of MAC operation in memory.

Benefits of non-volatile IMC (NVM-based IMC) rely on, non-volatile storage, data movement reducing. However, challenges of NVM-based IMC are that large power budget requirement due to large summation current after weighted, error-bit effect for representation of most significant bit (MSB), indistinguishable current summation results and large number of ADC/DAC which increase power consumption and chip size.

SUMMARY

According to one embodiment, provided is a memory device including: a memory array including a plurality of memory cells for storing a plurality of weights; a multiplication circuit coupled to the memory array, for performing bitwise multiplication on a plurality of input data and the weights to generate a plurality of multiplication results; a counting unit coupled to the multiplication circuit, for performing bitwise counting on the multiplication results to generate a MAC (multiplication and accumulation) operation result.

According to another embodiment, provided is an operation method for a memory device. The operation method includes: storing a plurality of weights in a plurality of memory cells of a memory array of the memory device; performing bitwise multiplication on a plurality of input data and the weights to generate a plurality of multiplication results; and performing bitwise counting on the multiplication results to generate a MAC (multiplication and accumulation) operation result.

BRIEF DESCRIPTION OF THE DRAWINGS

FIG. 3A to FIG. 3C show several possible example of data mapping according to embodiments of the application.

Figure 1:
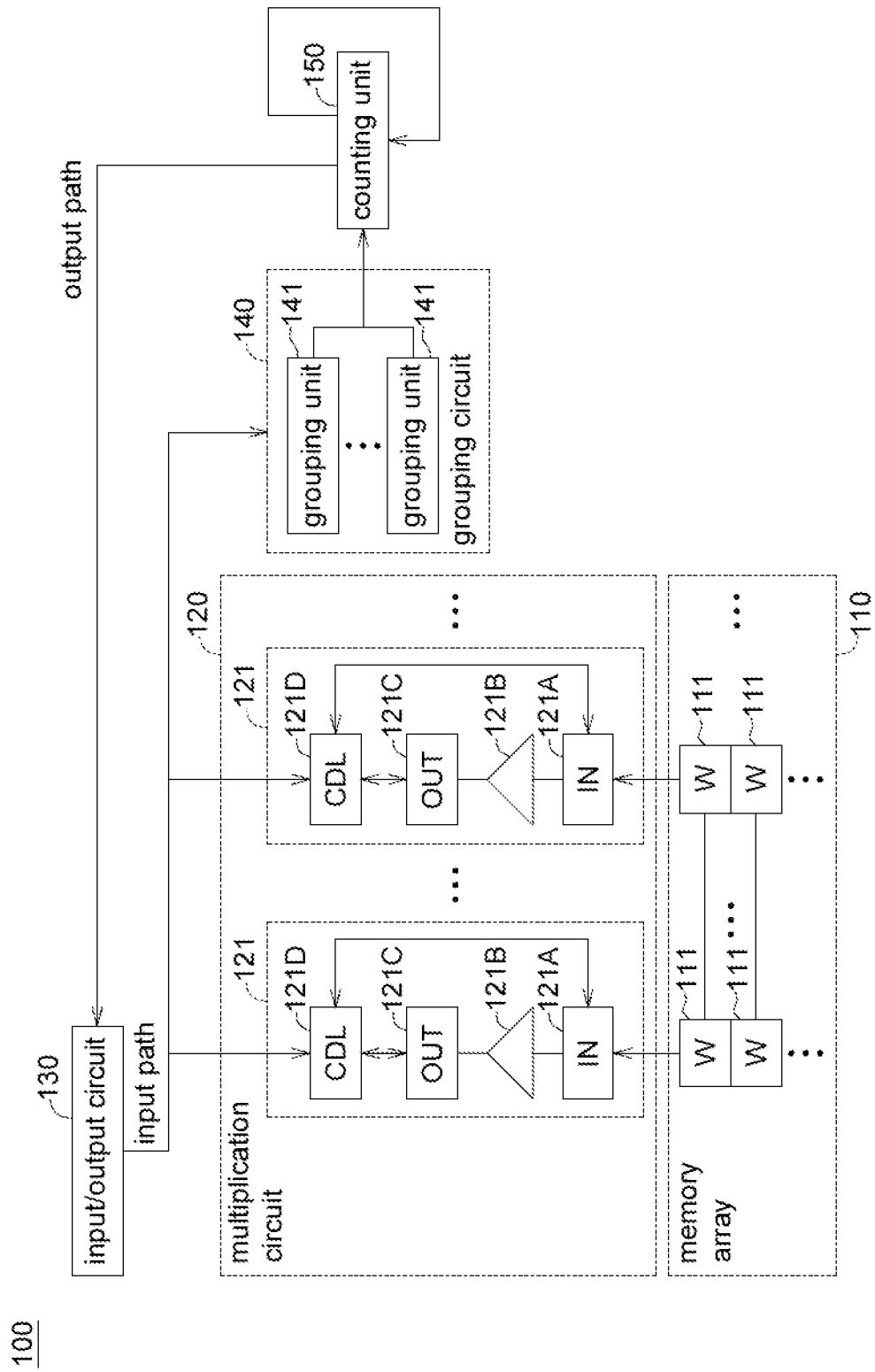
FIG. 1 shows a functional block diagram of an IMC (In-Memory-Computing) memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of an IMC (In-Memory-Computing) memory device 100 according to one embodiment of the application. The IMC memory device 100 includes a memory array 110, a multiplication circuit 120, an input/output circuit 130, a grouping circuit 140 and a counting unit 150. The memory array 110 and the multiplication circuit 120 are analog while the grouping circuit 140 and the counting unit 150 are digital.

The memory array 110 includes a plurality of memory cells 111. In one embodiment of the application, the memory cell 111 is for example but not limited by, a non-volatile memory cell. In MAC operations, the memory cells 111 are used for storing the weights.

The multiplication circuit 120 is coupled to the memory array 110. The multiplication circuit 120 includes a plurality of single-bit multiplication units 121. Each of the single-bit multiplication units 121 includes an input latch 121A, a sensing amplifier (SA) 121B, an output latch 121C and a common data latch (CDL) 121D. The input latch 121A is coupled to the memory array 110. The sensing amplifier 121B is coupled to the input latch 121A. The output latch 121C is coupled to the sensing amplifier 121B. The common data latch 121D is coupled to the output latch 121C.

The input/output circuit 130 is coupled to the multiplication circuit 120, the grouping circuit 140 and the counting unit 150. The input/output circuit 130 is for receiving the input data and for outputting data generated by the memory device 100.

The grouping circuit 140 is coupled to the multiplication circuit 120. The grouping circuit 140 includes a plurality of grouping units 141. The grouping units 141 perform grouping operations on a plurality of multiplication results from the single-bit multiplication units 121 to generate a plurality of grouping results. In one possible embodiment of the application, the grouping technique may be implemented by the majority technique, for example, the majority function technique, the grouping circuit 140 may be implemented by a majority grouping circuit based on the majority function technique, and the grouping units 141 may be implemented by a distributed majority grouping unit, which is not intended to limit the application. The grouping technique may be implemented by other similar techniques. In one embodiment of the application, the grouping circuit 140 is optional.

The counting unit 150 is coupled to the grouping circuit 140 or the multiplication circuit 120. In one embodiment of the application, the counting unit 150 is for performing bitwise counting or bitwise accumulating on the multiplication results from the multiplication circuit to generate a MAC operation result (when the memory device 100 does not include the grouping circuit 140). Or, the counting unit 150 is for performing bitwise counting or bitwise accumulating on the grouping results (i.e. the majority results) from the grouping circuit 140 to generate the MAC operation result (when the memory device 100 includes the grouping circuit 140). In one embodiment of the application, the counting unit 150 is implemented by known counting circuits, for example but not limited by, a ripple counter. In the application, the term "counting" and "accumulating" are interchangeable, and the counter and the accumulator have substantially the same meaning.

Figure 2:
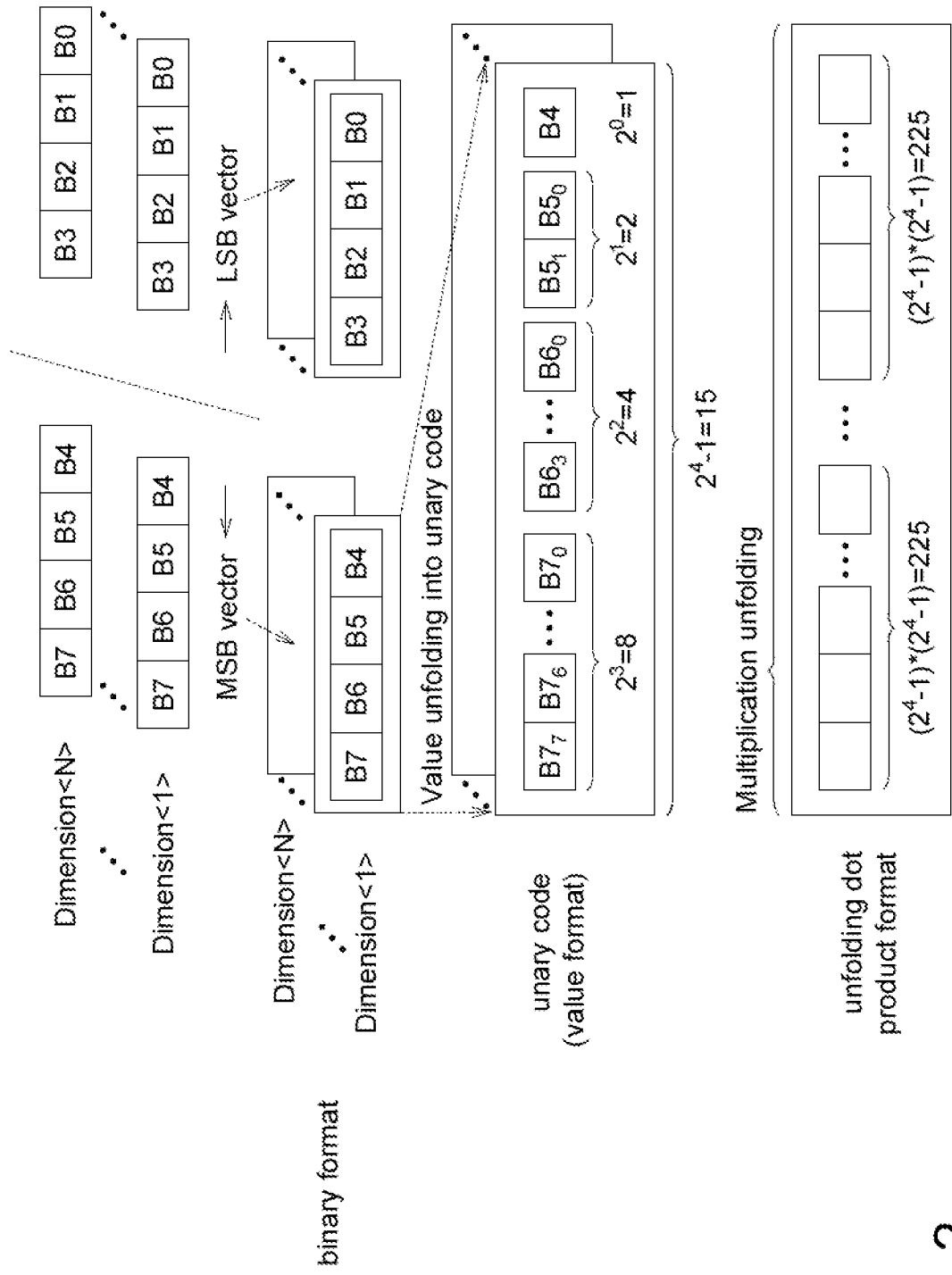
FIG. 2 shows data mapping according to one embodiment of the application.

Now refer to FIG. 2 which shows data mapping according to one embodiment of the application. As shown in FIG. 2, each input data and each weight have N dimension(s) (N being a positive integer) with 8-bit precision, but the application is not limited by this.

Data mapping of the input data is described as an example but the application is not limited by. The following description is also suitable for data mapping of the weights.

When the input data (or the weight) is represented by a binary 8-bit format, the input data (or the weight) includes a most significant bit (MSB) vector and a least significant bit (LSB) vector. The MSB vector of the 8-bit input data (or the weight) includes bits B7 to B4 and the LSB vector of the 8-bit input data (or the weight) includes bits B3 to B0.

Each bit of the MSB vector and the LSB vector of the input data is represented into unary code (value format). For example, the bit B7 of the MSB vector of the input data may be represented as $B7_0$-$B7_7$, the bit B6 of the MSB vector of the input data may be represented as $B6_0$-$B6_3$, the bit B5 of the MSB vector of the input data may be represented as $B5_0$-$B5_1$, and the bit B4 of the MSB vector of the input data may be represented as B4.

Then, each bit of the MSB vector of the input data and each bit of the LSB vector of the input data represented into unary code (value format) are respectively duplicated multiple times into an unfolding dot product (unFDP) format. For example, each of the MSB vector of the input data are duplicated by $(2^4-1)$ times, and similarly, each of the LSB vector of the input data are duplicated by $(2^4-1)$ times. By so, the input data are represented in the unFDP format. Similarly, the weights are also represented in the unFDP format.

Multiplication operation is performed on the input data (in the unFDP format) and the weights (in the unFDP format) to generate a plurality of multiplication results.

For understanding, one example of data mapping is described but the application is not limited thereby.

Figure 3A:
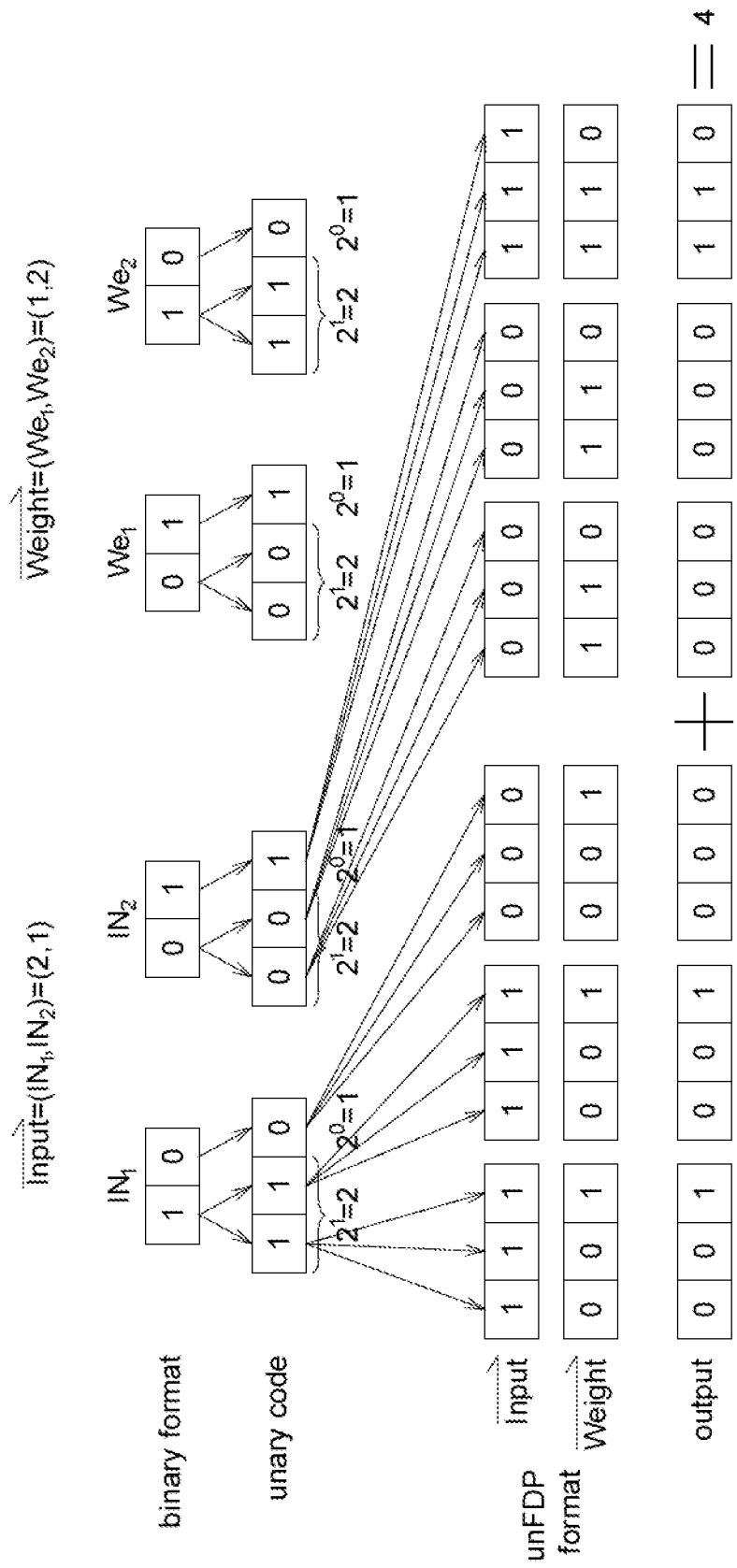

Now refer to FIG. 3A which shows one possible example of data mapping in one dimension according to one embodiment of the application. As shown in FIG. 3A, the input data is $(IN_1, IN_2)=(2, 1)$ and the weight is $(We_1, We_2)=(1, 2)$. The MSB and the LSB of the input data is represented in the binary format, and thus $IN_1=10$ while $IN_2=01$. Similarly, the MSB and the LSB of the weight is represented in the binary format, and thus $We_1=01$ while $We_2=10$.

Then, the MSB and the LSB of the input data, and the MSB and the LSB of the weight are encoded into unary code (value format). For example, the MSB of the input data is encoded into "110", while the LSB of the input data is encoded into "001". Similarly, the MSB of the weight is encoded into "001", while the LSB of the weight is encoded into "110".

Then, each bit of the MSB (110, encoded into the unary code) of the input data and each bit of the LSB (001, encoded into the unary code) of the input data are duplicated a plurality of times to be represented in the unFDP format. For example, each bit of the MSB (110, represented in the value format) of the input data is duplicated three times, and thus the unFDP format of the MSB of the input data is 111111000. Similarly, each bit of the LSB (001, represented in the value format) of the input data is duplicated three times, and thus the unFDP format of the LSB of the input data is 000000111.

The multiplication operation is performed on the input data (represented in the unFDP format) and the weights to generate an MAC operation result. The MAC operation result is $$1*0=0, 1*0=0, 1*1=1, 1*0=0, 1*0=0, 1*1=1, 0*0=0,$$
$$0*0=0, 0*1=0, 0*1=0, 0*1=0, 0*0=0, 0*1=0, 0*1=0,$$
$$0*0=0, 1*1=1, 1*1=1, 1*0=0.$$

The values are summed into:

$$0+0+1+0+0+1+0+0+0+0+0+0+0+0+0+0+1+1+0=4.$$

From the above description, when the input data is "i" bits while the weight is "j" bits (both "i" and "j" are positive integers), the total memory cell number used in the MAC (or the multiplication) operations will be $$(2^i-1)*(2^i-1).$$

Figure 3B:
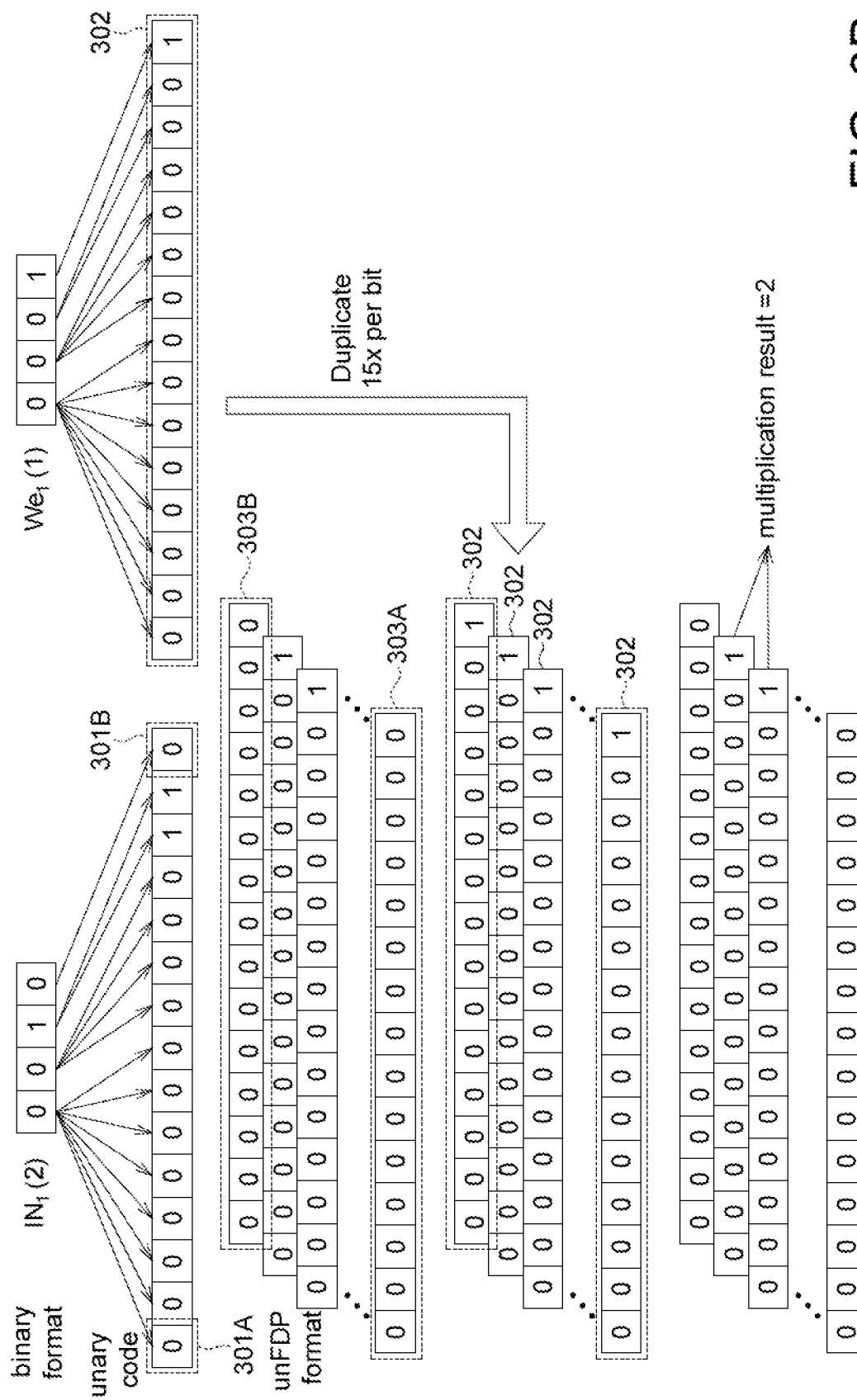

Now refer to FIG. 3B which shows another possible example of data mapping according to one embodiment of the application. As shown in FIG. 3B, the input data is $(IN_1)=(2)$ and the weight is $(We_1)=(1)$. The input data and the weight are in 4-bit.

The input data is represented in the binary format, and thus $IN_1=0010$. Similarly, the weight is represented in the binary format, and thus $We_1=0001$.

The input data and the weight are encoded into unary code (value format). For example, the highest bit "0" of the input data is encoded into "00000000", while the lowest bit "0" of the input data is encoded into "0" and so on. Similarly, the highest bit "0" of the weight is encoded into "00000000", while the lowest bit "1" of the weight is encoded into "1".

Then, each bit of the input data (encoded into the unary code) is duplicated a plurality of times to be represented in the unFDP format. For example, the highest bit 301A of the input data (encoded into the unary code) is duplicated fifteen times into the bits 303A; and the lowest bit 301B of the input data (encoded into the unary code) is duplicated fifteen times into the bits 303B.

The weight 302 (encoded into the unary code) is duplicated fifteen times to be represented in the unFDP format.

The multiplication operation is performed on the input data (represented in the unFDP format) and the weights (represented in the unFDP format) to generate an MAC operation result. In details, the bits 303A of the input data are multiplied by the weight 302; the bits 303B of the input data are multiplied by the weight 302; and so on. The MAC operation result ("2") is generated by adding the multiplication values.

Now refer to FIG. 3C which shows another possible example of data mapping according to one embodiment of the application. As shown in FIG. 3C, the input data is $(IN_1)=(1)$ and the weight is $(We_1)=(5)$. The input data and the weight are in 4-bit.

The input data is represented in the binary format, and thus $IN_1=0001$. Similarly, the weight is represented in the binary format, and thus $We_1=0101$.

Then, the input data and the weight are encoded into unary code (value format).

Then, each bit of the input data (encoded into the unary code) is duplicated a plurality of times to be represented in the unFDP format. In FIG. 3C, a bit "0" is added when each bit of the input data and each bit of the weight are duplicated. For example, the highest bit 311A of the input data (encoded into the unary code) is duplicated fifteen times and a bit "0" is added to form the bits 313A; and the lowest bit 311B of the input data (encoded into the unary code) is duplicated fifteen times and a bit "0" is added to form the bits 313B. By so, the input is represented in the unFDP format.

Similarly, the weight 312 (encoded into the unary code) is duplicated fifteen times and a bit "0" is additionally added into each of the weights 314. By so, the weight is represented in the unFDP format.

The multiplication operation is performed on the input data (represented in the unFDP format) and the weights (represented in the unFDP format) to generate an MAC operation result. In details, the bits 313A of the input data are multiplied by the weight 314; the bits 313B of the input data are multiplied by the weight 314; and so on. The MAC operation result ("5") is generated by adding the multiplication values.

In the prior art, in MAC operations on 8-bit input data and 8-bit weight, if direct MAC operations are used, then the total memory cell number used in the direct MAC operations will be $$255*255*512 = 33,292,822.$$

On the contrary, in one embodiment of the application, in MAC operations on 8-bit input data and 8-bit weight, the total memory cell number used in the direct MAC operations will be $$15*15*512*2 = 115,200*2 = 230,400.$$

Thus, the memory cell number used in the MAC operation according to one embodiment of the application is about 0.7% of the memory cell number used in the prior art.

In one embodiment of the application, by using unFDP-based data mapping, the memory cell number used in the MAC operation is reduced and thus the operation cost is also reduced. Further, ECC (error correction code) cost is also reduced and the tolerance of the fail-bit effect is improved.

Referring to FIG. 1 again. In one embodiment of the application, in multiplication operations, the weight (the transconductance) is stored in the memory cells 111 of the memory array 110 and the input data (the voltage) is stored read out by the input/output circuit 130 and transmitted to the common data latch 121D. The common data latch 121D outputs the input data to the input latch 121A.

Figure 4A:
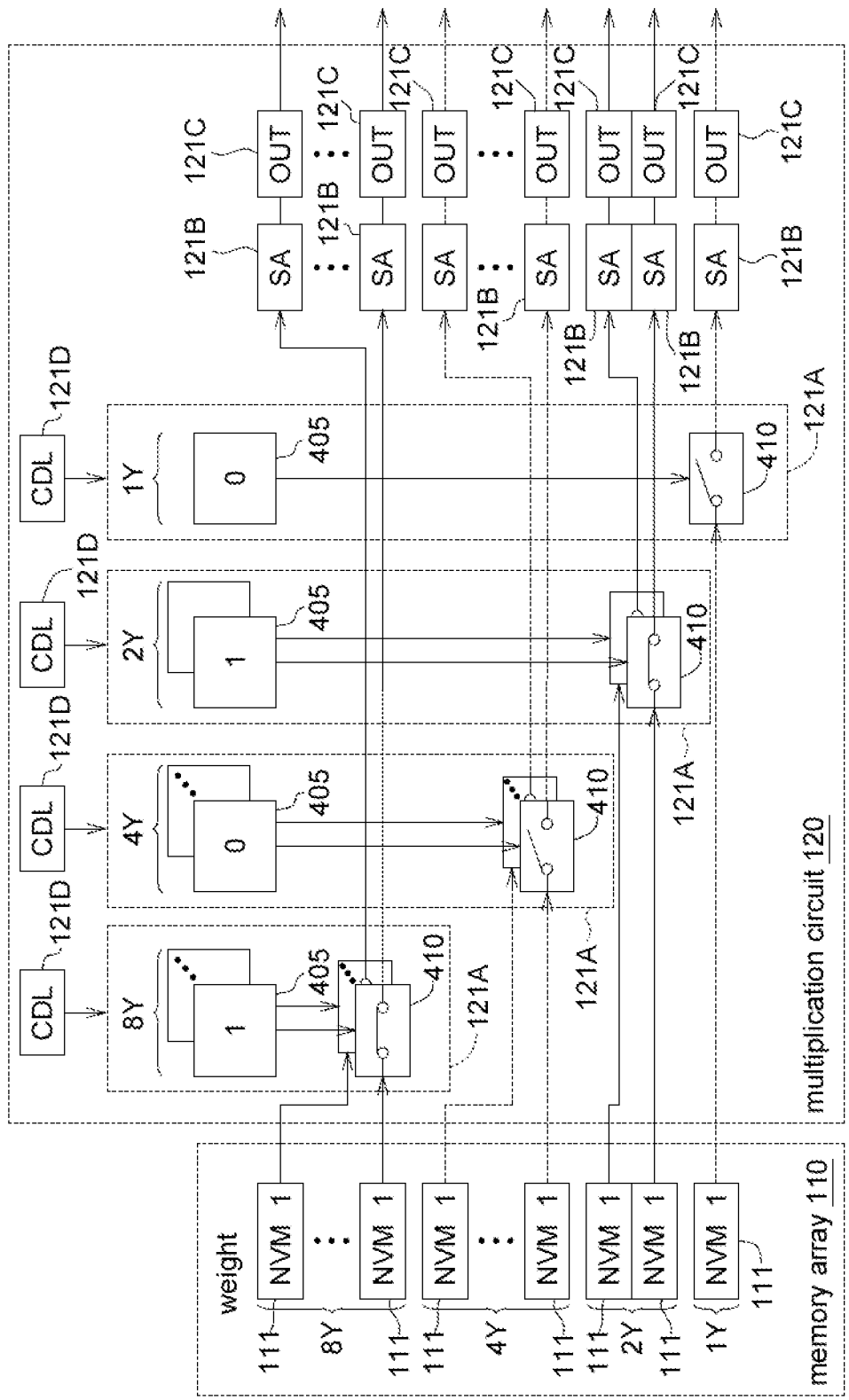
FIG. 4A and FIG. 4B show two examples of the multiplication operations of one embodiment of the application.
Figure 4B:
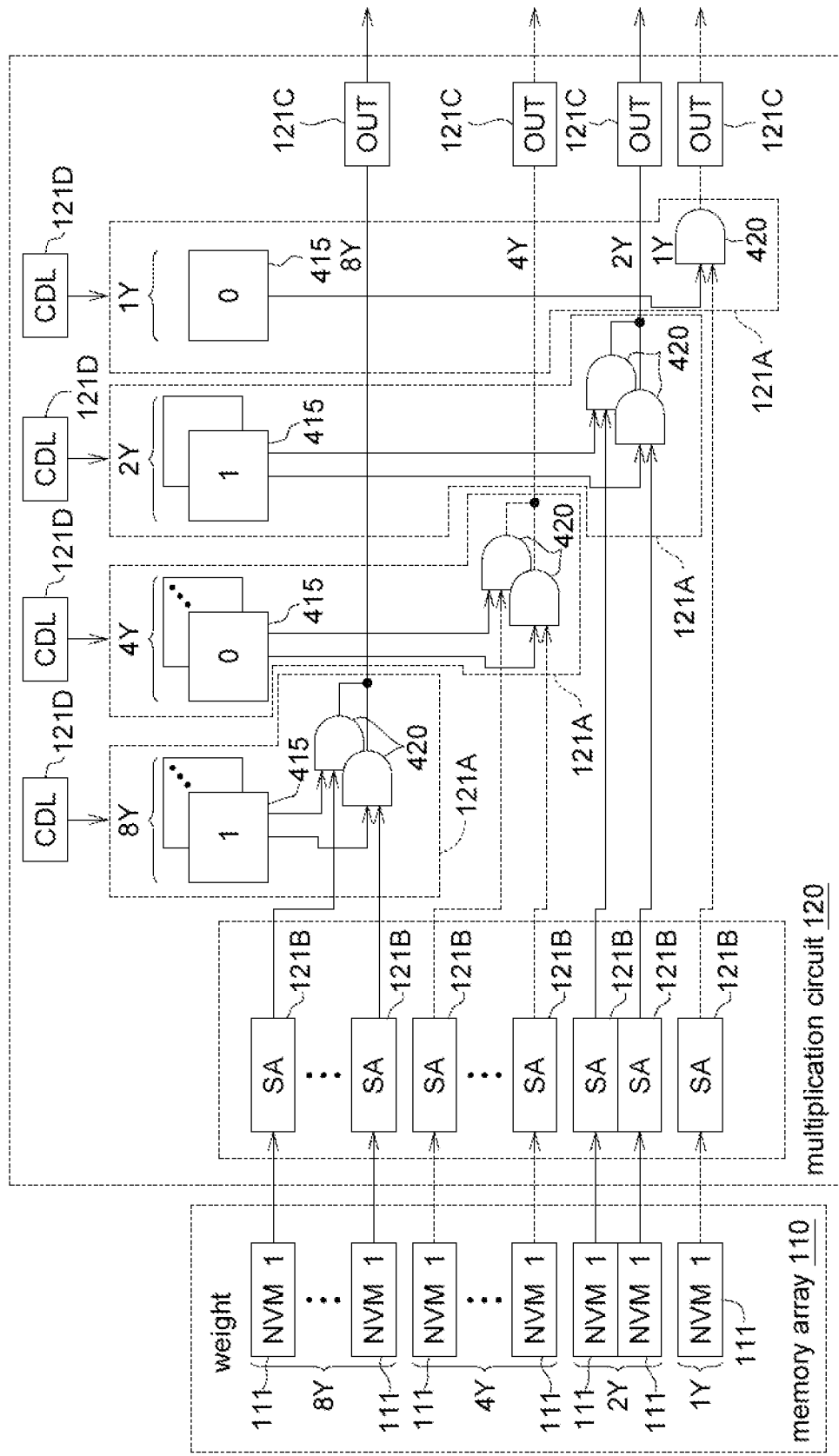

In order to explain the multiplication operations of one embodiment of the application, now refer to FIG. 4A and FIG. 4B which show two examples of the multiplication operations of one embodiment of the application. FIG. 4A is used in the case that the memory device supports the selected bit-line read function; and FIG. 4B is used in the case that the memory device does not support the selected bit-line read function. In FIG. 4A, the input latch 121A includes a latch (a first latch) 405 and a bit line switch 410; and In FIG. 4B, the input latch 121A includes a latch (a second latch) 415 and a logic AND gate 420.

As shown in FIG. 4A, the weight is represented into unary code (value format), as shown in FIG. 2. Thus, the highest bit of the weight is stored in eight memory cells 111, the second highest bit of the weight is stored in four memory cells 111, the third highest bit of the weight is stored in two memory cells 111 and the lowest bit of the weight is stored in one memory cell 111.

Similarly, the input data is represented into unary code (value format) (as shown in FIG. 2). Thus, the highest bit of the input data is stored in eight common data latches 121D, the second highest bit of the input data is stored in four common data latches 121D, the third highest bit of the input data is stored in two common data latches 121D and the lowest bit of the input data is stored in one common data latch 121D. The input data is sent from the common data latches 121D to the latches 405.

In FIG. 4A, the plurality of bit line switches 410 are coupled between the memory cells 111 and the sensing amplifiers 121B. The bit line switches 410 are controlled by outputs of the latches 405. For example, when the latch 405 outputs bit "1", the bit line switch 410 is conducted while when the latch 405 outputs bit "0", the bit line switch 410 is disconnected.

Further, when the weight stored in the memory cell 111 is bit 1 and the bit line switch 410 is conducted (i.e. the input data is bit 1), the SA 121B senses the memory cell current to generate the multiplication result "1". When the weight stored in the memory cell 111 is bit 0 and the bit line switch 410 is conducted (i.e. the input data is bit 1), the SA 121B senses no memory cell current. When the weight stored in the memory cell 111 is bit 1 and the bit line switch 410 is disconnected (i.e. the input data is bit 0), the SA 121B senses no memory cell current (to generate the multiplication result "0"). When the weight stored in the memory cell 111 is bit 0 and the bit line switch 410 is disconnected (i.e. the input data is bit 0), the SA 121B senses no memory cell current.

That is, via the layout shown in FIG. 4A, when the input data is bit 1 and the weight is bit 1, the SA 121B senses the memory cell current (to generate the multiplication result "1"). In other situations, the SA 121B senses no memory cell current (to generate the multiplication result "0").

In FIG. 4B, the input data is sent from the common data latches 121D to the latches 415. One input of the logic AND gate 420 receives the sensing result of the SA 121B (i.e. the weight) and the other input of the logic AND gate 420 receives the output bit of the latch 415 (i.e. the input data). When the weight stored in the memory cell 111 is bit 1, the sensing result of the SA 121B is logic high (i.e. the SA 121B senses the memory cell current); and when the weight stored in the memory cell 111 is bit 0, the sensing result of the SA 121B is logic low (i.e. the SA 121B senses no memory cell current).

When the latch 415 outputs bit 1 (i.e. the input data is bit 1) and the sensing result of the SA 121B is logic high (i.e. the weight is bit 1), the logic AND gate 420 outputs bit 1 (to generate the multiplication result "1") to the grouping circuit 140 or to the counting unit 150. In the other situations, the logic AND gate 420 outputs bit 0 (to generate the multiplication result "0") to the grouping circuit 140 or to the counting unit 150.

The embodiment shows in FIG. 4B is applied in both non-volatile memory and volatile memory.

In one embodiment of the application, in multiplication operations, the selected bit line read (SBL-read) command may be reused to reduce the variation influence due to single-bit representation.

Figure 5A:
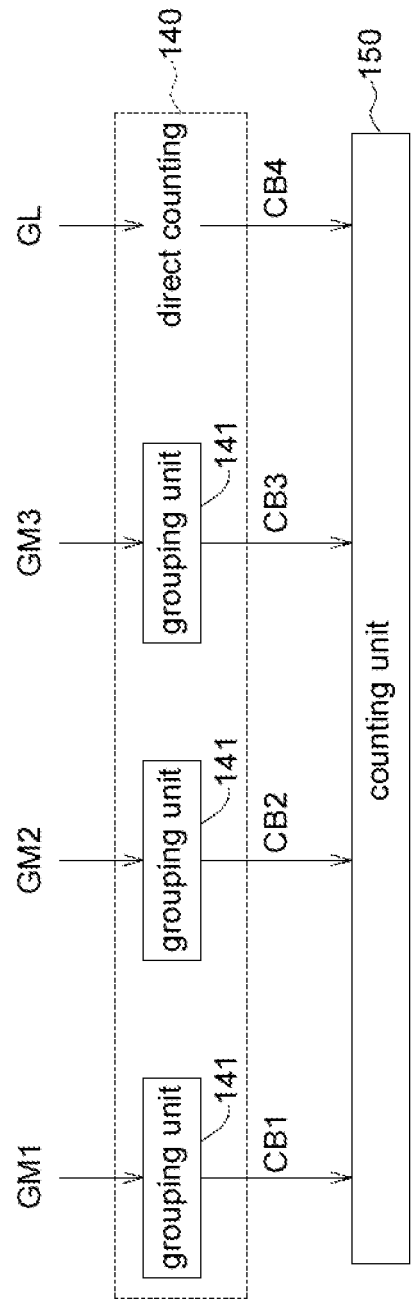
FIG. 5A and FIG. 5B show the grouping operation (the majority operation) and counting according to one embodiment of the application.

Now refer to FIG. 5A, which shows the grouping operation (the majority operation) and bitwise counting according to one embodiment of the application. As shown in FIG. 5A, "GM1" refers to a first multiplication result from bitwise multiplication on the first MSB vector of the input data by the weights; "GM2" refers to a second multiplication result from bitwise multiplication on the second MSB vector of the input data by the weights; "GM3" refers to a third multiplication result from bitwise multiplication on the third MSB vector of the input data by the weights; and "GL" refers to a fourth multiplication result from bitwise multiplication on the LSB vector of the input data by the weights. After the grouping operation (the majority operation), the grouping result performed on the first multiplication result "GM1" is a first grouping result CB1 (whose accumulation weight is $2^2$); the grouping result performed on the second multiplication result "GM2" is a second grouping result CB2 (whose accumulation weight is $2^2$); the grouping result performed on the third multiplication result "GM3" is a third grouping result CB3 (whose accumulation weight is $2^2$); and the direct counting result on the fourth multiplication result "GL" is a fourth grouping result CB4 (whose accumulation weight is $2^0$).

Figure 5B:
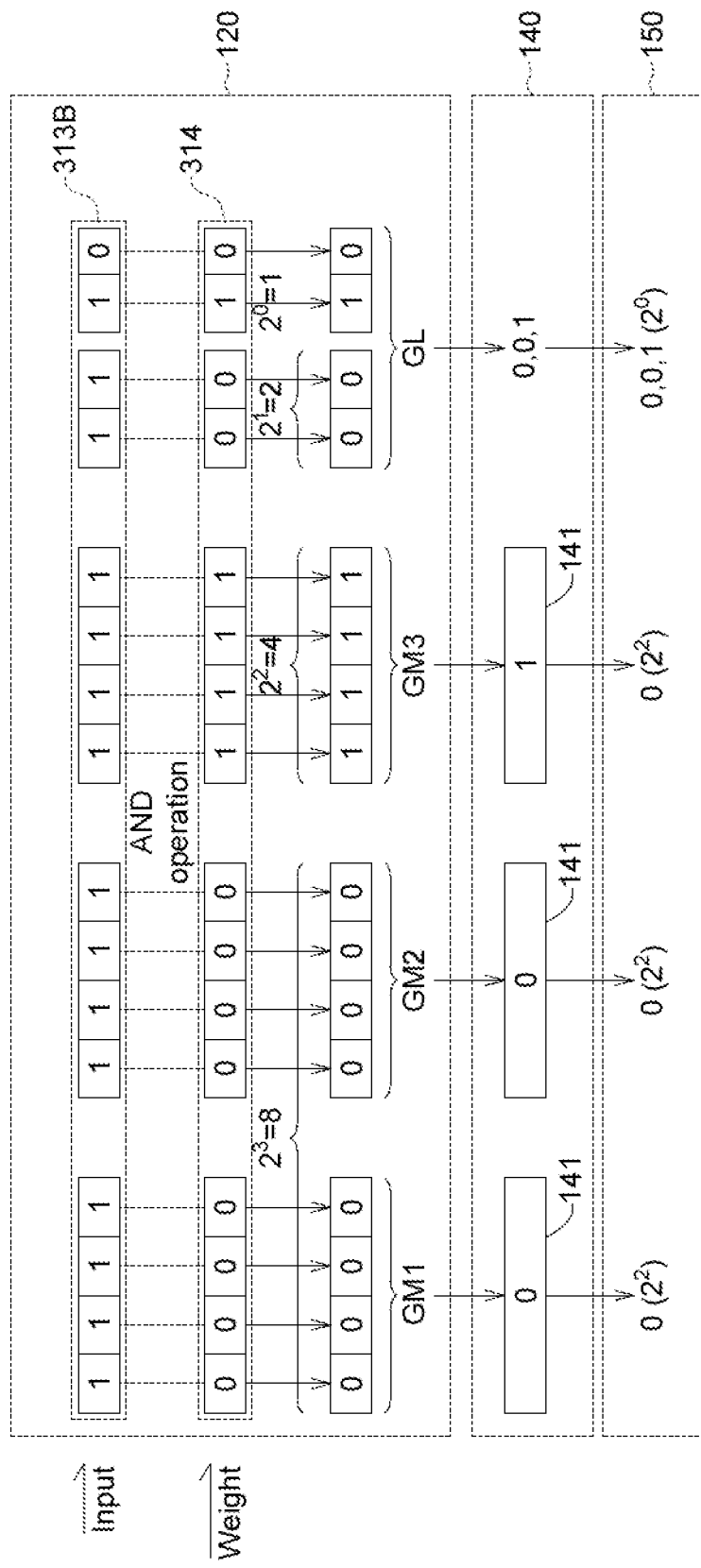

FIG. 5B shows one accumulation example in FIG. 3C. Refer to FIG. 3C and FIG. 5B. As shown in FIG. 5B, the bits 313B of the input data (in FIG. 3C) are multiplied by the weight 314. The first four bits ("0000") of the multiplication result, generated by multiplication of the bits 313B of the input data (in FIG. 3C) with the weight 314, are grouped as the first multiplication result "GM1". Similarly, the fifth to the eighth bits ("0000") of the multiplication result, generated by multiplication of the bits 313B of the input data (in FIG. 3C) with the weight 314, are grouped as the second multiplication result "GM2". The ninth to the twelfth bits ("1111") of the multiplication result, generated by multiplication of the bits 313B of the input data (in FIG. 3C) with the weight 314, are grouped as the third multiplication result "GM3". The thirteenth to the sixteenth bits ("0010") of the multiplication result, generated by multiplication of the bits 313B of the input data (in FIG. 3C) with the weight 314, are directly counted.

After the grouping operation (the majority operation), the first grouping result CB1 is "0" (whose accumulation weight is $2^2$); the second grouping result CB2 is "0" (whose accumulation weight is $2^2$); the third grouping result CB3 is "1" (whose accumulation weight is $2^2$). In counting, the MAC result is generated by accumulating the respective grouping results CB1~CB4 multiplied by the respective accumulation weight. For example, as shown in FIG. 5B, the MAC result is:

$$CB1*2^2 + CB2*2^2 + CB3*2^2 + CB4*2^0 =$$
$$0*2^2 + 0*2^2 + 1*2^2 + 1*2^0 =$$
$$0000\ 0000\ 0000\ 0000\ 0000\ 0000\ 0000\ 0101 = 5.$$

In one embodiment of the application, the grouping principle (for example, the majority principle) is as follows.

| Group bits | Grouping result (Majority result) |
| --- | --- |
| 1111 (case A) | 1 |
| 1110 (case B) | 1 |
| 1100 (case C) | 1 or 0 |
| 1000 (case D) | 0 |
| 0000 (case E) | 0 |

In the above table, in case A, because the group has correct bits ("1111" which means no error bits), the majority result is 1. Similarly, in the above table, in case E, because the group has correct bits ("0000" which means no error bits), the majority result is 0.

In case B, because the group has one error bit (among "1110", the bit "0" is error), by majority function, the group "1110" is determined to be "1". In case D, because the group has one error bit (among "0001", the bit "1" is error), by majority function, the group "0001" is determined to be "0".

In case C, because the group has two error bits (among "1100", the bits "00" or "11" are error), by majority function, the group "1100" is determined to be "1" or "0".

Thus, in one embodiment of the application, by grouping (majority) function, the error bits are reduced.

The majority results from the grouping circuit 140 are input into the counting unit 150 for bitwise counting.

In counting, the counting result for the multiplication results of the MSB vector and the counting result for the multiplication results of the LSB vector are add or accumulated. As shown in FIG. 5A, two accumulators are used. A first accumulator is assigned by a heavy accumulating weight (for example $2^2$). The first accumulator is accumulating: (1) the grouping result (the majority result) (having one bit) from performing the grouping operation (the majority operation) on the multiplication result GM1, (2) the grouping result (the majority result) (having one bit) from performing the grouping operation (the majority operation) on the multiplication result GM2, and (3) the grouping result (the majority result) (having one bit) from performing the grouping operation (the majority operation) on the multiplication result GM3. The accumulation result by the first accumulator is assigned by heavy accumulating weight (for example $2^2$). A second accumulator is assigned by a light accumulating weight (for example $2^0$). The second accumulator is directly accumulating the multiplication result GL (having multiple bits). The two accumulation results by the two accumulators are added to output the MAC operation result. For example but not limited by, (1) the grouping result (the majority result) (having one bit) from performing the grouping (majority) operation on the multiplication result GM1 is "1" (one bit), (2) the grouping result (the majority result) (having one bit) from performing the grouping (majority) operation on the multiplication result GM2 is "0" (one bit), and (3) the grouping result (the majority result) (having one bit) from performing the grouping (majority) operation on the multiplication result GM3 is "1" (one bit). The accumulation result by the first accumulator, after weighting, is $$2(=1+0+1)*2^2=8.$$

The multiplication result GL is 4 (having three bits). The MAC operation result is $$8+4=12.$$

From the above, in one embodiment of the application, in counting or accumulation, the input data is in the unFDP format, data stored in the CDL is grouped into the MSB vector and the LSB vector. By group (majority) function, the error bits in the MSB vector and the LSB vector are reduced.

Further, in one embodiment of the application, even the conventional accumulator (the conventional counter) is used, the time cost in counting and accumulating is also reduced. This is because digital counting command (error bit counting) is applied in one embodiment of the application and different vectors (the MSB vector and the LSB vector) are assigned by different accumulating weights. In one possible example, the time cost in accumulation operation is reduced to about 40%.

Figure 6:
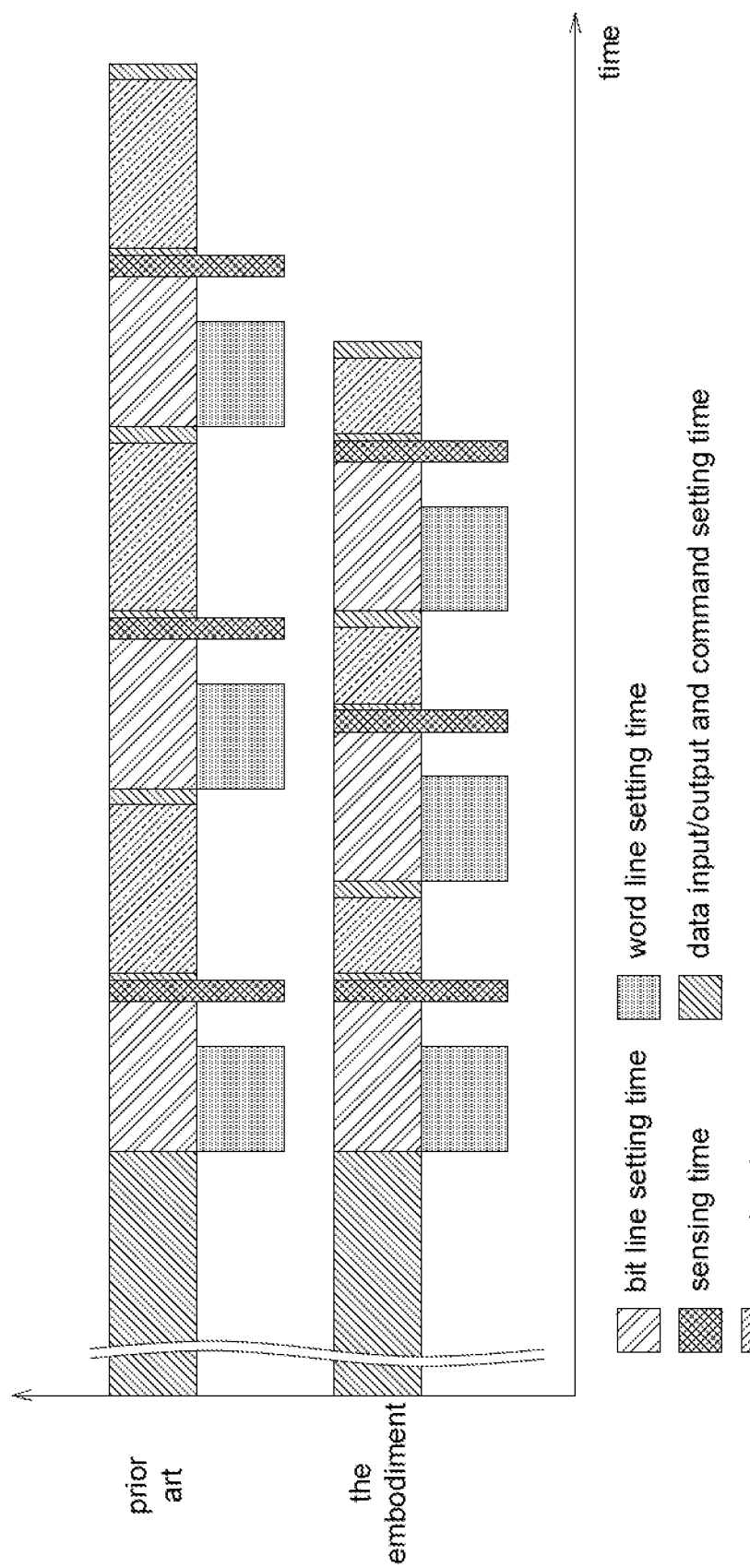
FIG. 6 shows MAC operation flow compared with the prior art and one embodiment of the application.

FIG. 6 shows MAC operation flow compared with the prior art and one embodiment of the application. In MAC operation flow of the prior art and one embodiment of the application, the input data is transmitted to the memory device. The bit line setting and the word line setting are performed concurrently. After the bit line setting, sensing is performed. Then, the accumulation is performed. The accumulation result is returned. The above steps are repeated until all input data is processed.

From FIG. 6, the MAC operation in the embodiment of the application has two types of sub-operations. The first sub-operation is multiplication to multiply the input data with the weights, which is based on the selected bit line read command. The second sub-operation is accumulation (data counting), especially, fail bit counting. In other possible embodiment of the application, more counting unit may be used to speed up the counting or accumulation operations.

Compared with the prior art, in one embodiment of the application, the accumulation operation is faster and thus the MAC operations are also faster.

Figure 7A:
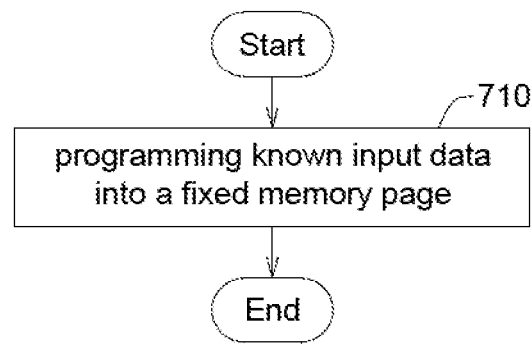
FIG. 7A shows programming a fixed memory page in one embodiment of the application.

Still further, in one embodiment of the application, the read voltage is also adjusted. FIG. 7A shows programming a fixed memory page in one embodiment of the application.

Figure 7B:
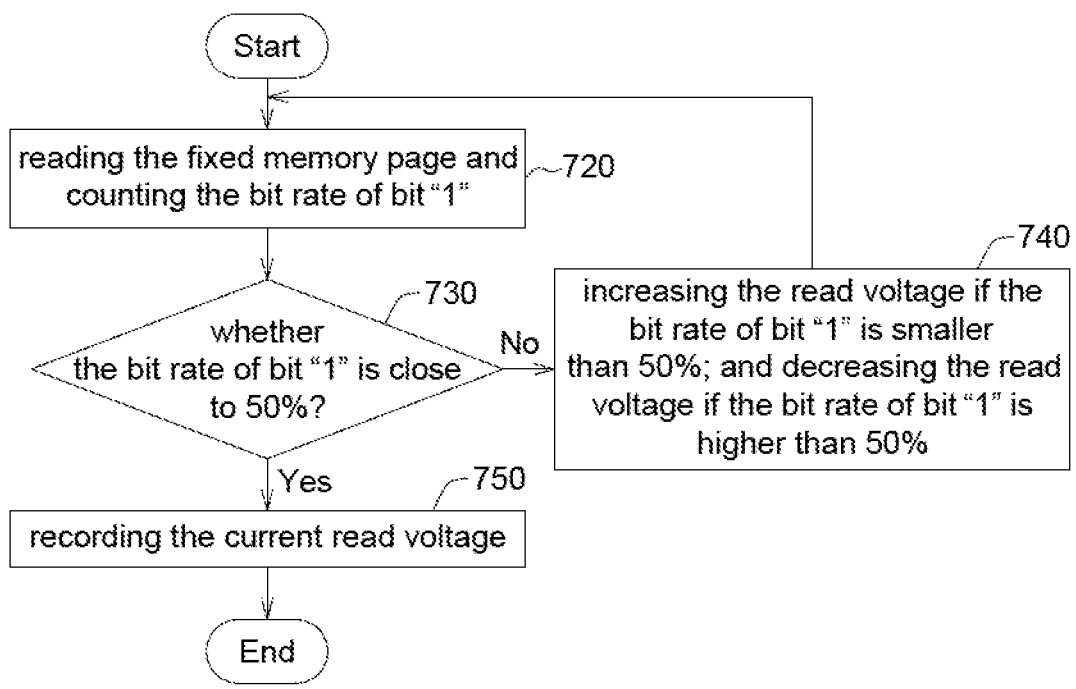
FIG. 7B shows a flow chart for read voltage adjustment in one embodiment of the application.

FIG. 7B shows a flow chart for read voltage adjustment in one embodiment of the application.

As shown in FIG. 7A, in step 710, known input data is programmed into a fixed memory page, wherein bit rate of the known input data is 50% of bit "0" and 50% of bit "1".

As shown in FIG. 7B, in step 720, the fixed memory page is read and the bit rate of bit "1" is counted. In step 730, whether the bit rate of bit "1" is close to 50% is determined. If no in step 730, then the flow proceeds to step 740. If yes in step 730, then the flow proceeds to step 750.

In step 740, if the bit rate of bit "1" is smaller than 50%, then the read voltage is increased; and if the bit rate of bit "1" is higher than 50%, then the read voltage is decreased. After step 740, the flow returns to step 720.

In step 750, the current read voltage is recorded for subsequent read operation.

The read voltage may effect reading of bit 1. In one embodiment of the application, based on the operation conditions (for example but not limited by, the programming cycle, the temperature or the read disturbance), the read voltage may be periodically calibrated to keep high accuracy and high reliability.

Figure 8:
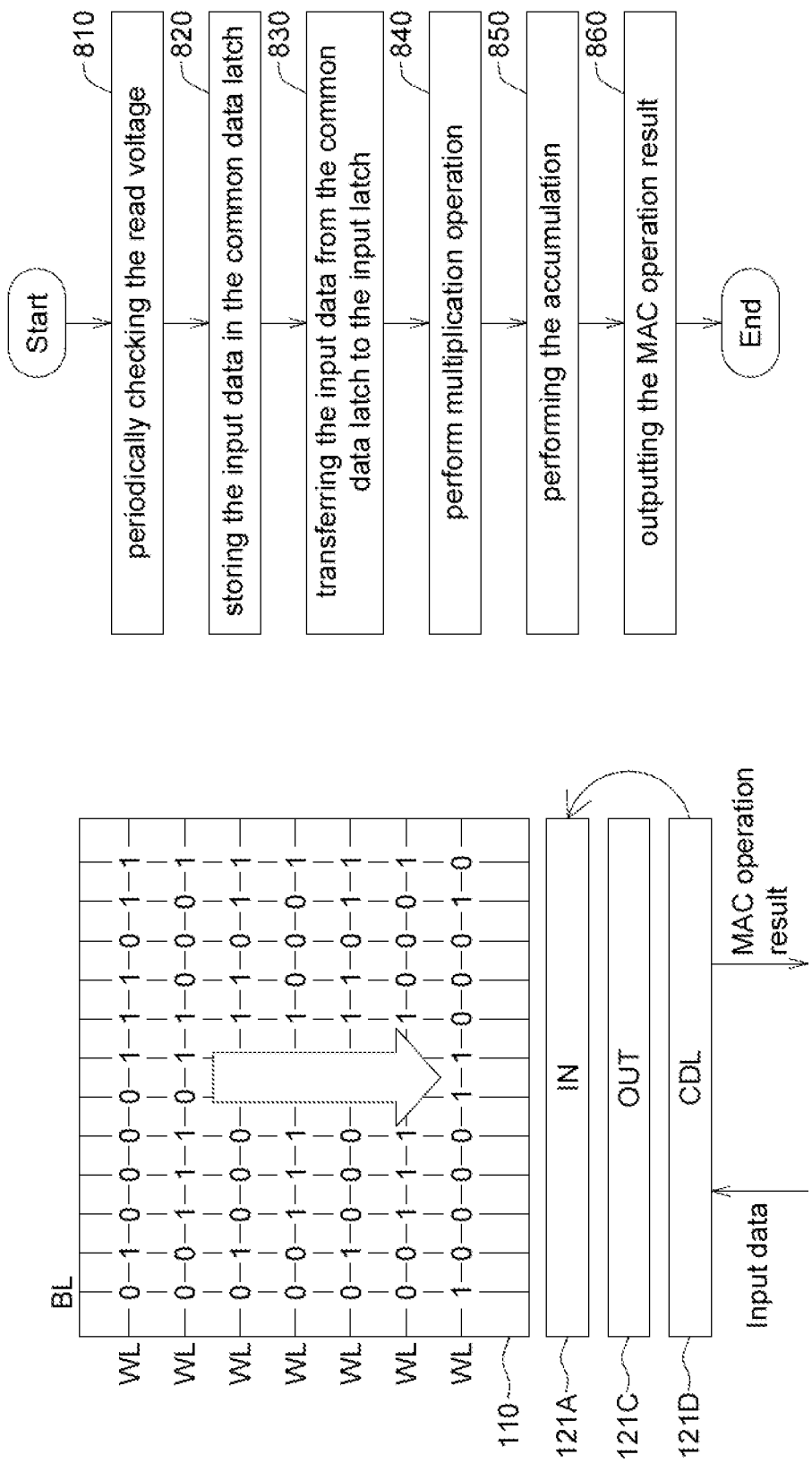
FIG. 8 shows a MAC operation flow according to one embodiment of the application.

FIG. 8 shows a MAC operation flow according to one embodiment of the application. In step 810, the read voltage is periodically checked. If the read voltage is to be calibrated, then the read voltage is calibrated according to the flow in FIG. 7B.

In step 820, the input data is stored in the common data latch 121D.

In step 830, the input data is transferred from the common data latch 121D to the input latch 121A.

In step 840, the multiplication operation is performed in either the selected bit line read command is enabled (supported) or the selected bit line read command is not enabled (not supported).

In step 850, the accumulation is performed.

In step 860, the MAC operation result is output (for example, via the input/output circuit 30).

One embodiment of the application is applied to NAND type flash memory, or the memory device sensitive to the retention and thermal variation, for example but not limited by, NOR type flash memory, phase changing memory, magnetic RAM or resistive RAM.

One embodiment of the application is applied in 3D structure memory device and 2D structure memory device, for example but not limited by, 2D/3D NAND type flash memory, 2D/3D NOR type flash memory, 2D/3D phase changing memory, 2D/3D magnetic RAM or 2D/3D resistive RAM.

Although in the embodiment of the application, the input data and/or the weight are divided into the MSB vector and the LSB vector (i.e. two vectors), but the application is not limited by this. In other possible embodiment of the application, the input data and/or the weight are divided into more vectors, which is still within the spirit and the scope of the application.

The embodiment of the application is not only applied to majority group technique, but also other grouping techniques to speed up accumulation.

The embodiment of the application is AI techniques, for example but not limited by, face identification.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device including:
a memory array including a plurality of memory cells for storing a plurality of weights;
a multiplication circuit coupled to the memory array, for performing bitwise multiplication on a plurality of input data and the weights to generate a plurality of multiplication results; and
a counting unit coupled to the multiplication circuit, for performing bitwise counting on the multiplication results to generate a MAC (multiplication and accumulation) operation result;
wherein
a plurality of bits of each of the input data or each of the weights are divided into a plurality of bit vectors;
each bit of the bit vectors is transformed from a binary format into a unary code;
said each bit of the bit vectors represented in the unary code is duplicated a plurality of times into an unFDP (unfolding dot product) format; and
the multiplication circuit performs multiplication operations on the input data and the weights represented in the unFDP format to generate the multiplication results.

2. The memory device according to claim 1, wherein the multiplication circuit includes a plurality of single-bit multiplication unit,
each of the plurality of single-bit multiplication unit includes:
an input latch coupled to the memory array;
a sensing amplifier coupled to the input latch;
an output latch coupled to the sensing amplifier; and
a common data latch, coupled to the output latch;
wherein the common data latch sends the input data to the input latch.

3. The memory device according to claim 2, wherein the single-bit multiplication unit generates and sends the multiplication result to the counting unit.

4. The memory device according to claim 2, further including a grouping circuit, coupled to the multiplication circuit and the counting unit, for performing grouping operations on the multiplication results from the multiplication circuit to generate a plurality of grouping results and for sending the grouping results to the counting unit, wherein the single-bit multiplication unit generates and sends the multiplication result to the grouping circuit.

5. The memory device according to claim 1, further including an input/output circuit, coupled to the multiplication circuit and the counting unit, for receiving the input data and outputting the MAC operation result generated by the memory device.

6. The memory device according to claim 4, wherein the grouping circuit includes a plurality of grouping units, for performing grouping operations on the multiplication results to generate the grouping results.

7. The memory device according to claim 4, wherein the memory array and the multiplication circuit are analog and the grouping circuit and the counting unit are digital.

8. The memory device according to claim 2, wherein each of the input latches includes a first latch and a bit line switch, the first latches receive the input data from the common data latches, the bit line switches are coupled between the memory cells and the sensing amplifiers, the bit line switches are controlled by the input data stored in the first latches to control whether to conduct the weights stored in the memory cells to the sensing amplifiers, and the sensing amplifiers generate the multiplication results by sensing outputs from the bit line switches.

9. The memory device according to claim 2, wherein each of the input latches includes a second latch and a logic gate, the second latches receive the input data from the common data latches, the sensing amplifiers sense the weights stored in the memory cells, and the logic gates generate the multiplication results based on the input data sent from the second latch and the weights stored in the memory cells via the sensing amplifiers.

10. The memory device according to claim 6, wherein in performing grouping operations on the multiplication results, the grouping circuit performing respective grouping operations on the multiplication results to generate the grouping results.

11. The memory device according to claim 10, wherein in bitwise counting, the grouping results are respectively assigned by different accumulating weights to generate the MAC operation result.

12. The memory device according to claim 4, wherein the grouping circuit is a majority circuit including a plurality of majority units.

13. An operation method for a memory device, the operation method including:
storing a plurality of weights in a plurality of memory cells of a memory array of the memory device;
performing bitwise multiplication on a plurality of input data and the weights to generate a plurality of multiplication results; and
performing bitwise counting on the multiplication results to generate a MAC (multiplication and accumulation) operation result;
wherein
a plurality of bits of each of the input data or each of the weights are divided into a plurality of bit vectors;
each bit of the bit vectors is transformed from a binary format into a unary code;
said each bit of the bit vectors represented in the unary code is duplicated a plurality of times into an unFDP (unfolding dot product) format; and
the multiplication circuit performs multiplication operations on the input data and the weights represented in the unFDP format to generate the multiplication results.

14. The operation method for the memory device according to claim 13, further including performing grouping operations on the multiplication results to generate a plurality of grouping results.

15. The operation method for the memory device according to claim 14, wherein in bitwise counting, the grouping results are respectively assigned by different accumulating weights to generate the MAC operation result.

16. The operation method for the memory device according to claim 14, wherein performing grouping operations on the multiplication results is implemented by performing majority operations on the multiplication results.

* * * * *